United States Patent
Her et al.

(10) Patent No.: US 11,029,886 B2
(45) Date of Patent: Jun. 8, 2021

(54) MEMORY SYSTEM AND METHOD OF OPERATING MEMORY SYSTEM

(71) Applicant: SK hynix Inc., Icheon-si (KR)

(72) Inventors: Min Ho Her, Cheongju-si (KR); Sung Ho Kim, Cheongju-si (KR); Seung Il Kim, Cheongju-si (KR); Jae Min Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/666,220

(22) Filed: Oct. 28, 2019

(65) Prior Publication Data

US 2021/0026564 A1    Jan. 28, 2021

(30) Foreign Application Priority Data

Jul. 24, 2019  (KR) .................. 10-2019-0089453

(51) Int. Cl.
  *G06F 3/06*  (2006.01)
(52) U.S. Cl.
  CPC .......... *G06F 3/0659* (2013.01); *G06F 3/0619* (2013.01); *G06F 3/0652* (2013.01); *G06F 3/0679* (2013.01)
(58) Field of Classification Search
  CPC .... G06F 3/0659; G06F 3/0679; G06F 3/0652; G06F 3/0619; G11C 29/04
  See application file for complete search history.

(56) References Cited

U.S. PATENT DOCUMENTS

| | | | |
|---|---|---|---|
| 2004/0190360 A1* | 9/2004 | Scheuerlein | H01L 27/115 365/225.7 |
| 2011/0073923 A1 | 3/2011 | Tatani et al. | |
| 2011/0320688 A1* | 12/2011 | Lee | G06F 12/0246 711/103 |
| 2013/0047132 A1* | 2/2013 | Kim | G06F 12/0246 716/132 |

(Continued)

FOREIGN PATENT DOCUMENTS

| | | |
|---|---|---|
| KR | 101105635 B1 | 1/2012 |
| KR | 10-2014-0015292 A | 2/2014 |

(Continued)

OTHER PUBLICATIONS

Non-Final Office Action dated Oct. 26, 2020 for U.S. Appl. No. 16/600,164 (22 pages).

*Primary Examiner* — Khamdan N. Alrobaie
(74) *Attorney, Agent, or Firm* — Perkins Coie LLP

(57) ABSTRACT

The present technology relates to a memory system and a method of operating the memory system. The memory system includes a memory device including a plurality of memory blocks, the memory device configure to perform on each of the plurality of memory blocks at least one of a program operation, a read operation, or an erase operation in response to an internal command; and a controller in communication with a host and the memory device and configured to receive a request from the host and generate the internal command in response to the request from the host, the controller further configured to control the memory device to perform a stress check operation on a first memory block of the plurality of memory blocks in which the program operation has been completed.

17 Claims, 9 Drawing Sheets

(56) References Cited

U.S. PATENT DOCUMENTS

| | | | |
|---|---|---|---|
| 2013/0308401 A1* | 11/2013 | Yang | G11C 29/06 |
| | | | 365/191 |
| 2015/0169247 A1* | 6/2015 | Wang | G06F 7/582 |
| | | | 711/103 |
| 2015/0187436 A1* | 7/2015 | Querbach | G11C 29/1201 |
| | | | 714/720 |
| 2016/0125956 A1* | 5/2016 | Magia | G11C 16/349 |
| | | | 714/719 |
| 2016/0343454 A1* | 11/2016 | Pachamuthu | G11C 16/349 |
| 2016/0343770 A1 | 11/2016 | Fan | |
| 2019/0267103 A1* | 8/2019 | Jung | G11C 16/28 |

FOREIGN PATENT DOCUMENTS

| | | |
|---|---|---|
| KR | 1020160061673 | 6/2016 |
| KR | 1020180059208 | 6/2018 |

* cited by examiner

MEMORY SYSTEM AND METHOD OF OPERATING MEMORY SYSTEM

CROSS-REFERENCE TO RELATED APPLICATION

This patent document claims priority to and benefits of the Korean patent application number 10-2019-0089453, filed on Jul. 24, 2019, which is incorporated herein by reference in its entirety.

TECHNICAL FIELD

The technology and implementations disclosed in this patent document relate to an electronic device, and more particularly, to a memory system and a method of operating the memory system.

BACKGROUND

Recently, a paradigm for a computer environment has been transformed into ubiquitous computing, which enables a computer system to be used whenever and wherever. Therefore, a use of a portable electronic device such as a mobile phone, a digital camera, and a notebook computer is rapidly increasing. Such a portable electronic device generally includes a data storage device operating together with a memory device. The data storage device can be used as a main storage device or an auxiliary storage device of the portable electronic device.

The data storage device operating with the memory device does not need a mechanical drive unit and thus has an excellent stability and durability. In addition, it is possible to quickly access information, and power consumption is low. Examples of the data storage device having such advantages include a data storage device that includes a universal serial bus (USB) memory device, a memory card having various interfaces, a solid state drive (SSD), and others.

A memory device can be classified into a volatile memory device and a non-volatile memory device. While write and read speeds of the non-volatile memory device are relatively slow, non-volatile memory device maintains the stored data even though the power supply is interrupted. Therefore, non-volatile memory devices are used to store data which needs to be maintained regardless of the power supply. A non-volatile memory device can include a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and others. Flash memory can be classified into a NOR type and a NAND type.

SUMMARY

This patent document describes, among other features and benefits, a memory system and a method of operating the memory system, which are capable of improving reliability of data stored in the memory system.

A memory system according to an embodiment of the disclosed technology includes a memory device including a plurality of memory blocks, the memory device configure to perform on each of the plurality of memory blocks at least one of a program operation, a read operation, or an erase operation in response to an internal command; and a controller in communication with a host and the memory device and configured to receive a request from the host and generate the internal command in response to the request from the host, the controller further configured to control the memory device to perform a stress check operation on a first memory block of the plurality of memory blocks in which the program operation has been completed.

A memory system according to an embodiment of the disclosed technology includes a memory device including a plurality of memory blocks, the memory device configured to perform on each of the plurality of memory blocks at least one of a program operation, a read operation, or an erase operation; and a controller in communication with the memory device. The controller including a stress check component configured to instruct the memory device to perform a stress check operation for a first memory block of the plurality of memory blocks, and generate a first command for a test read operation based on a result of the stress check operation; an error correction component configured to detect one or more error bits in the data read during the test read operation, and produce a count of the detected error bits; and a reclaim control component configured to generate a second command for a read reclaim operation based on the count of the detected error bits.

A method of operating a memory system according to an embodiment of the disclosed technology includes performing a program operation on a first memory block included in the memory system, wherein the memory system includes at least a second memory block coupled to a word line to which the first memory block is coupled; performing one or more operations on the second memory block, the one or more operations including a program operation, a read operation, or an erase operation; and performing a stress check operation on the first memory block to determine a stress value of the first memory block.

The present technology may improve data reliability of a selected memory block by checking stress by the memory block sharing the word lines with the selected memory block and performing the test read operation of the selected memory block according to a check result.

DETAILED DESCRIPTION

Hereinafter, embodiments of the disclosed technology will be described in detail with reference to the accompanying drawings.

Figure 1:
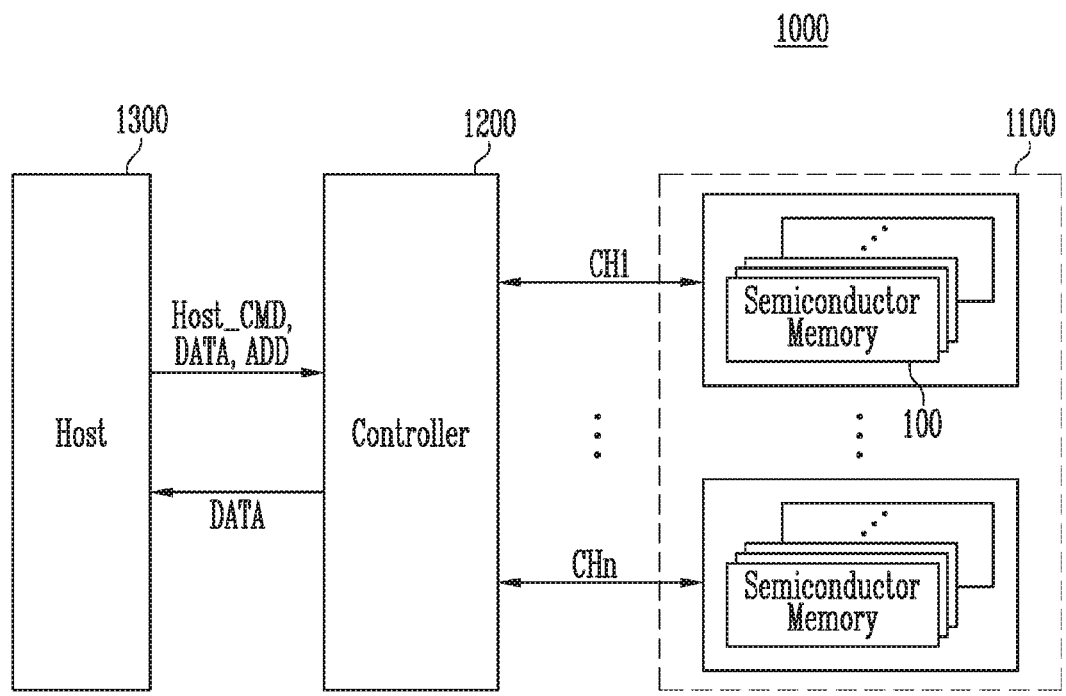
FIG. 1 is a block diagram illustrating an example memory system based on some implementations of the disclosed technology.

FIG. 1 is a block diagram illustrating a memory system based on some implementations of the disclosed technology.

Referring to FIG. 1, the memory system 1000 includes a memory device 1100, a controller 1200, and a host 1300. The memory device 1100 includes a plurality of semiconductor memories 100. The plurality of semiconductor memories 100 may form a plurality of groups. Although the host 1300 is illustrated and described as being included in the memory system 1000 in the specific example as shown in FIG. 1, the host 1300 can be disposed outside the memory system 1000. In this case, the memory system 1000 may be configured to include the controller 1200 and the memory device 1100 without the host 1300.

In FIG. 1, the memory device 1100 includes a plurality of groups, where each group includes semiconductor memories, that communicate with the controller 1200 through first to n-th channels CH1 to CHn, respectively. Each semiconductor memory 100 will be described later with reference to FIG. 3.

Semiconductor memories in each semiconductor memory group are configured to communicate with the controller 1200 through one common channel. The controller 1200 is configured to control the plurality of semiconductor memories 100 of the memory device 1100 through the plurality of channels CH1 to CHn. Each of the channels CH1 to CHn is configured to control the plurality of semiconductor memories in each semiconductor memory group.

The controller 1200 is provided between the host 1300 and the memory device 1100. The controller 1200 is configured to access the memory device 1100 in response to a request from the host 1300. For example, the controller 1200 is configured to control read, write, erase, and/or background operations of the memory device 1100 in response to a host command (Host_CMD) received from the host 1300. During the write operation, the host 1300 may transmit an address (ADD) and data (DATA) together with the host command (Host_CMD); during the read operation, the host 1300 may transmit the address (ADD) together with the host command (Host_CMD). The controller 1200 transmits the read data (DATA) to the host 1300 during the read operation. The controller 1200 is configured to provide an interface between the memory device 1100 and the host 1300. The controller 1200 is configured to drive the firmware for controlling the memory device 1100.

After a program operation of a selected memory block among memory blocks included in the memory device 1100 is completed, the controller 1200 may perform a stress check operation of the selected memory block. The stress check operation can be done using at least one or more memory blocks sharing word lines with the selected memory block. For example, the stress check operation for the selected memory block measures a stress value based on the number of program operations, the number of read operations, and the number of erase operations performed on at least one or more memory blocks sharing the word lines with the selected memory block.

The controller 1200 may control the memory device 1100 to perform a test read operation on the selected memory block when the stress value measured as a result of the stress check operation of the selected memory block is equal to or greater than a set value.

The controller 1200 may count the number of error bits included in data read as a result of the test read operation of the selected memory block, and when the number of counted error bits is equal to or greater than a set number, the controller 1200 may performs a read reclaim operation on the selected memory block.

The host 1300 includes a portable electronic device such as a computer, a PDA, a PMP, an MP3 player, a camera, a camcorder, or a mobile phone. The host 1300 may request the memory system 1000 through the host command (Host_CMD) to perform a write operation, a read operation, an erase operation, or others. The host 1300 may transmit the host command (Host_CMD), the data (DATA), and the address (ADD) corresponding to a write command to the controller 1200 for the program operation of the memory device 1100 and may transmit the host command (Host_CMD) and the address (ADD) corresponding to a read command for the read operation to the controller 1200. In some implementations, the address (ADD) may be or include a logical address of data.

The controller 1200 and the memory device 1100 may be integrated into one semiconductor device. As an exemplary embodiment, the controller 1200 and the memory device 1100 may be integrated into a one semiconductor device to configure a memory card. For example, the controller 1200 and the memory device 1100 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), or a universal flash stage device (UFS).

The controller 1200 and the memory device 1100 may be integrated into a one semiconductor device to configure a solid state drive (SSD). The semiconductor drive (SSD) includes a storage device configured to store data in the semiconductor memory.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an exemplary embodiment, the memory device 1100 or memory system 1000 may be mounted using various types of packaging configurations and techniques. For example, the memory device 1100 or the memory system 1000 may be packaged and mounted using techniques such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a thin quad flat pack (TQFP), a system in package (SIP), a multi-chip package (MCP), a wafer-level fabricated package (WFP), or a wafer-level processed stack package (WSP).

Figure 2:
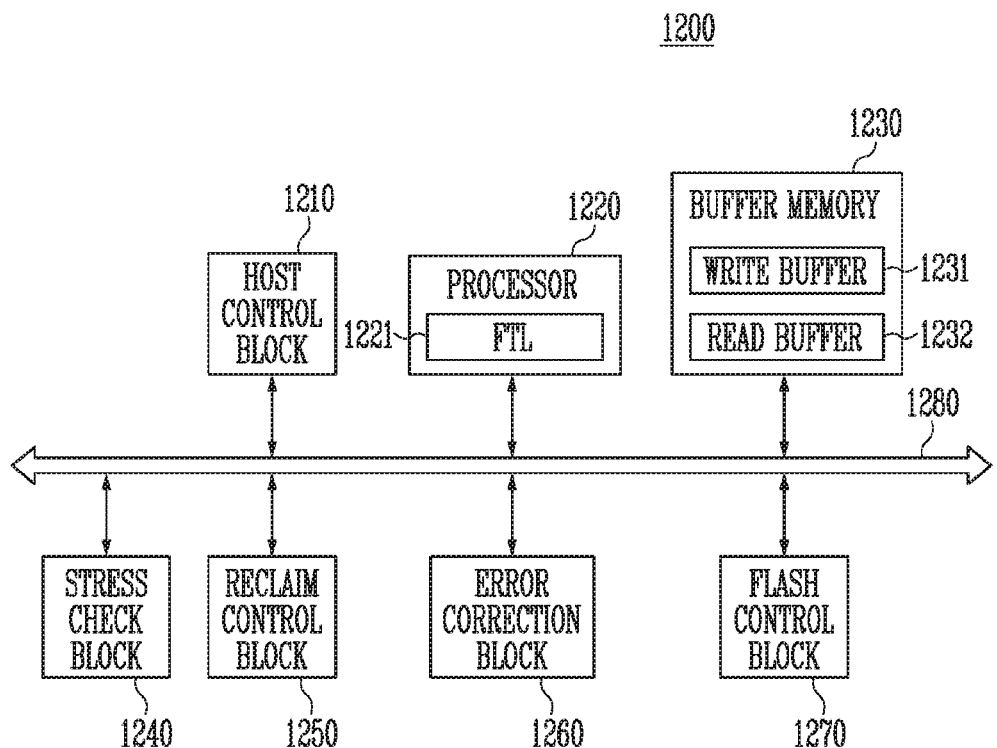
FIG. 2 is a block diagram illustrating a configuration of an example controller of FIG. 1.

FIG. 2 is a block diagram illustrating an example configuration the controller of FIG. 1.

Referring to FIG. 2, the controller 1200 may include a host control block 1210, a processor 1220, a buffer memory 1230, a stress check block 1240, a reclaim control block 1250, an error correction block 1260, a flash control block 1270, and a bus 1280.

The bus 1280 may be configured to provide a channel between components of the controller 1200.

The host control block 1210 may control data transmission between the host 1300 of FIG. 1 and the buffer memory 1230. As an example, the host control block 1210 may control an operation of buffering of data input from the host 1300, which occurs in the buffer memory 1230. As another example, the host control block 1210 may control an operation of outputting data buffered in the buffer memory 1230 to the host 1300.

In addition, the host control block 1210 may transmit the host command and the address received from the host 1300 to the processor 1220.

The host control block 1210 may include a host interface.

The processor 1220 may control operations of the controller 1200 and perform a logical operation. The processor 1220 may communicate with the host 1300 of FIG. 1 through the host control block 1210 and may communicate with the memory device 1100 of FIG. 1 through the flash control block 1270. In some implementations, the processor 1220 may control the operation of the memory system 1000 using the buffer memory 1230 as an operation memory or a cache memory. The processor 1220 may rearrange a plurality of host commands received from the host 1300 in priority order to generate a command queue for controlling the flash control block 1270.

The processor 1220 may include a flash translation layer (hereinafter, referred to as 'FTL') 1221.

The flash translation layer (FTL) 1221 drives the firmware. The firmware may be stored in the buffer memory 1230, an additional memory (not shown) directly connected to the processor 1220, or a storage space in the processor 1220. In some implementations, the flash translation layer (FTL) 1221 may map a physical address corresponding to the address (for example, a logical address) input from the host 1300 of FIG. 1 during the write operation. In some implementations, the flash translation layer (FTL) 1221 checks the physical address mapped to the logical address input from the host 1300 during the read operation.

In some implementations, the flash translation layer (FTL) may generate the command queue for controlling the flash control block 1270 in response to the host command received from the host 1300.

The buffer memory 1230 may be used as an operation memory or a buffer of the processor 1220. The buffer memory 1230 may store codes and commands executed by the processor 1220. The buffer memory 1230 may store data that is processed by the processor 1220.

The buffer memory 1230 may include a write buffer 1231 and a read buffer 1232. The write buffer 1231 temporarily stores the data received together with the write command from the host 1300 and then transmits the temporarily stored data to the memory device 1100. The read buffer 1232 temporarily stores data received from the memory device 1100 during the read operation, and then transmits the temporarily stored data to the host 1300. In addition, the read buffer 1232 temporarily stores valid data received from the selected memory block of the memory device 1100 during the read reclaim operation, and then transmits the temporarily stored valid data to a target memory block of the memory device 1100.

The buffer memory 1230 may include a static RAM (SRAM) or a dynamic RAM (DRAM).

The stress check block 1240 performs a stress check operation of the selected memory block in which the program operation is completed. The stress check block 1240 counts the number of program operations, the number of read operations, and the number of erase operations of at least one or more shared memory blocks sharing word lines with the selected memory block. The stress check block 1240 measures the stress value of the selected memory block based on the counted value, which is caused by the operations including the program operation, the read operation, the erase operation of the shared memory blocks.

The stress check block 1240 controls the flash control block 1270 to perform a test read operation for the selected memory block when the measured stress value of the selected memory block is equal to or greater than a set value. For example, when the stress value of the selected memory block is equal to or greater than the set value, the stress check block 1240 may generate a command corresponding to the test read operation of the selected memory block and queue the generated command in a command queue.

The reclaim control block 1250 controls the buffer memory 1230 and the flash control circuit 1270 to perform a read reclaim operation for the selected memory block. The reclaim control block 1250 compares the number of error bits included in the read data with a set value as a result of the test read operation of the selected memory block, generates a command corresponding to the read reclaim operation for the selected memory block based on a comparison result, and queues the generated command in a command queue. The read reclaim operation will be described in detail later with reference to FIG. 7.

As an example, the stress check block 1240 and the reclaim control block 1250 may be included in the processor 1220 as a component of the processor 1220.

The error correction block 1260 may perform error correction. The error correction block 1260 may perform error correction encoding (ECC encoding) on the data to be written to the memory device 1100 of FIG. 1 through the flash control block 1270. The error correction encoded data may be transferred to the memory device 1100 through the flash control block 1270. The error correction block 1260 may perform error correction decoding (ECC decoding) on the data received from the memory device 1100 through the flash control block 1270.

In some implementations, the error correction block 1260 may detect the number of error bits included in the data read from the selected memory block during the test read operation and may count the detected number of error bits. The counted number of error bits may be transmitted to the reclaim control block 1250.

As an example, the error correction block 1260 may be included in the flash control block 1270 as a component of the flash control block 1270.

The flash control block 1270 generates and outputs an internal command for controlling the memory device 1100 in response to the command queue generated by the processor 1220. The flash control block 1270 may control the program operation by transmitting the buffered data to the write buffer 1231 of the buffer memory 1230 and to the memory device 1100 during the write operation. As another example, the flash control block 1270 may control the buffering operation of data read from the memory device 1100 to the read buffer 1232 in response to the command queue during the read operation. In some implementations, the flash control block 1270 generates and outputs an internal command for controlling the memory device 1100 to perform the test read operation for the selected memory block in response to the command queue in which the command corresponding to the test read operation generated by the stress check block 1240 is queued.

In some implementations, the flash control block 1270 generates and outputs an internal command for controlling the memory device 1100 to perform the read reclaim operation for the selected memory block in response to the command queue in which the command corresponding to the read reclaim operation generated by the reclaim control block 1250 is queued during the read reclaim operation. For example, the flash control block 1270 controls the memory device 1100 to read valid data from the selected memory block among the plurality of memory blocks included in the memory device 1100, receives the read valid data, and stores the valid data in the read buffer 1232 of the buffer memory 1230. In some implementations, the flash control block 1270 may control the memory device 1100 so that the valid data stored in the read buffer 1232 is stored in a target memory block among the plurality of memory blocks included in the memory device 1100.

The flash control block 1270 may include a flash interface.

Figure 3:
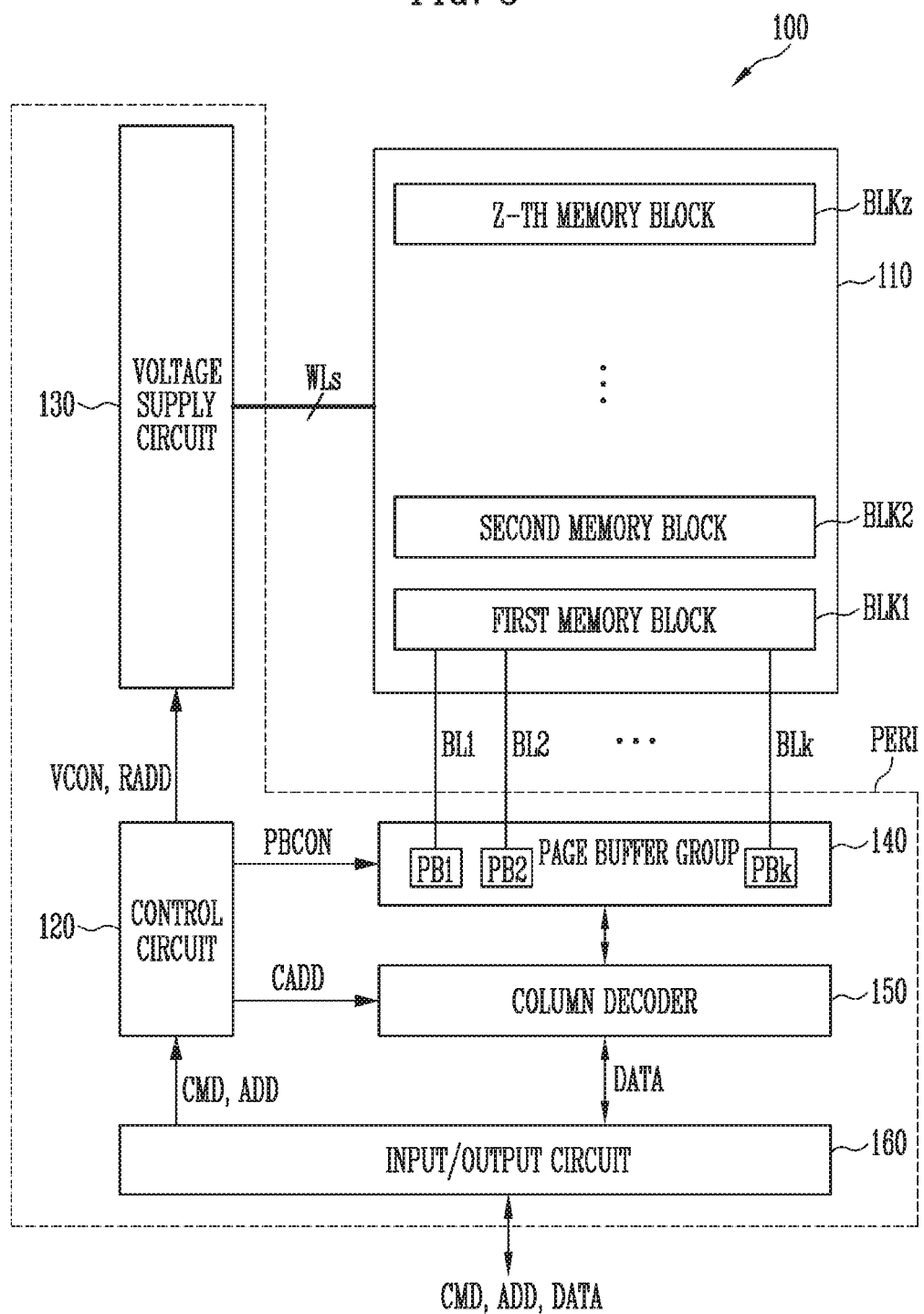
FIG. 3 is a diagram illustrating an example semiconductor memory of FIG. 1.

FIG. 3 is an example block diagram for describing the semiconductor memory of FIG. 1.

Referring to FIG. 3, the semiconductor memory 100 includes a memory cell array 110 including a plurality of memory blocks BLK1 to BLKz, and a peripheral circuit PERI configured to perform a program operation, a read operation, or an erase operation of memory cells included in a selected page of the plurality of memory blocks BLK1 to BLKz. The peripheral circuit PERI includes a control circuit 120, a voltage supply circuit 130, a page buffer group 140, a column decoder 150, and an input/output circuit 160.

The memory cell array 110 includes the plurality of memory blocks BLK1 to BLKz. Each of the plurality of memory blocks BLK1 to BLKz includes a plurality of pages. Each of the plurality of pages includes a plurality of memory cells. In an embodiment, the plurality of memory cells are non-volatile memory cells. This is described in more detail with reference to FIGS. 4 and 5.

The control circuit 120 outputs a voltage control signal (VCON) for generating a voltage required to perform the read operation, the program operation, or the erase operation in response to an internal command (CMD) input from the outside through the input/output circuit 160, and a PB control signal (PBCON) for controlling the page buffers PB1 to PBk included in the page buffer group 140 according to a type of an operation. In some implementations, the control circuit 120 outputs a row address signal (RADD) and a column address signal (CADD) in response to the address signal (ADD) input from the outside through the input/output circuit 160.

In response to the voltage control signal (VCON) of the control circuit 120, the voltage supply circuit 130 supplies the operation voltages required for the program operation, the read operation, and the erase operation of the memory cells to local lines including a drain select line, word lines WLs, and a source select line of the selected memory block. Such a voltage supply circuit 130 includes a voltage generation circuit and a row decoder.

In response to the voltage control signal (VCON) of the control circuit 120, the voltage generation circuit outputs the operation voltages to global lines, which are required for at least one of the program operation, the read operation, or the erase operation of the memory cells.

In response to the row address signals (RADD) of the control circuit 120, the row decoder connects the global lines and the local lines with each other so that the operation voltages output from the voltage generation circuit to the global lines are transferred to the local lines of the memory block selected in the memory cell array 110.

The page buffer group 140 includes a plurality of page buffers PB1 to PBk connected to the memory cell array 110 through bit lines BL1 to BLk. In response to the PB control signal (PBCON) of the control circuit 120, the page buffers PB1 to PBk of the page buffer group 140 selectively pre-charges the bit lines BL1 to BLk according to the data (DATA) input to store in the memory cells or senses voltages of the bit lines BL1 to BLk to read the data DATA from the memory cells.

The input/output circuit 160 transfers the data DATA input to store in the memory cells to the page buffer group 140 to the column decoder 150 under the control of the control circuit 120 during the program operation. When the column decoder 150 transfers the data DATA transferred from the input/output circuit 160 to the page buffers PB1 to PBk of the page buffer group 140, the page buffers PB1 to PBk store the input data DATA in an internal latch circuit. In some implementations, during the read operation, the input/output circuit 160 outputs the data DATA transferred through the column decoder 150 from the page buffers PB1 to PBk of the page buffer group 140 to the outside.

During the test read operation of the selected memory block (for example, BLK1) among the plurality of memory blocks BLK1 to BLKz, the semiconductor memory 100 according to the embodiment of the disclosed technology reads the data stored in the selected memory block BLK1 and outputs the data to the controller 1200 of FIG. 1. For example, the control circuit 120 controls the voltage supply circuit 130, the page buffer group 140, the column decoder 150, and the input/output circuit 160 to perform the test read operation in response to the command CMD corresponding to the test read operation and the address ADD corresponding to the selected memory block BLK1.

Figure 4:
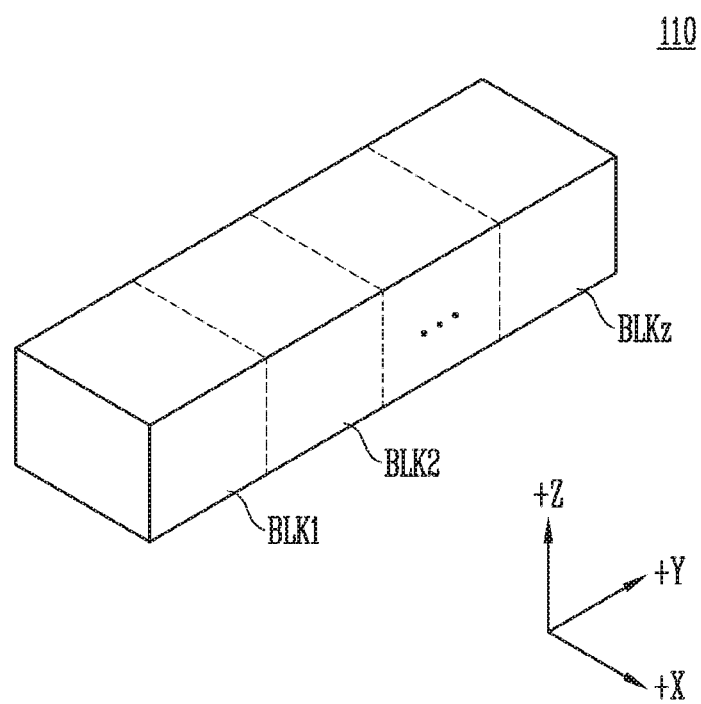
FIG. 4 is a block diagram illustrating an embodiment of an example memory cell array of FIG. 3.

FIG. 4 is a block diagram illustrating an embodiment of the memory cell array of FIG. 3.

Referring to FIG. 4, the memory cell array 110 includes a plurality of memory blocks BLK1 to BLKz. Each memory block has a three-dimensional structure. Each memory block includes a plurality of memory cells stacked on a substrate. The plurality of memory cells are arranged along +X, +Y, and +Z directions. A structure of each memory block is described in more detail with reference to FIG. 5.

Figure 5:
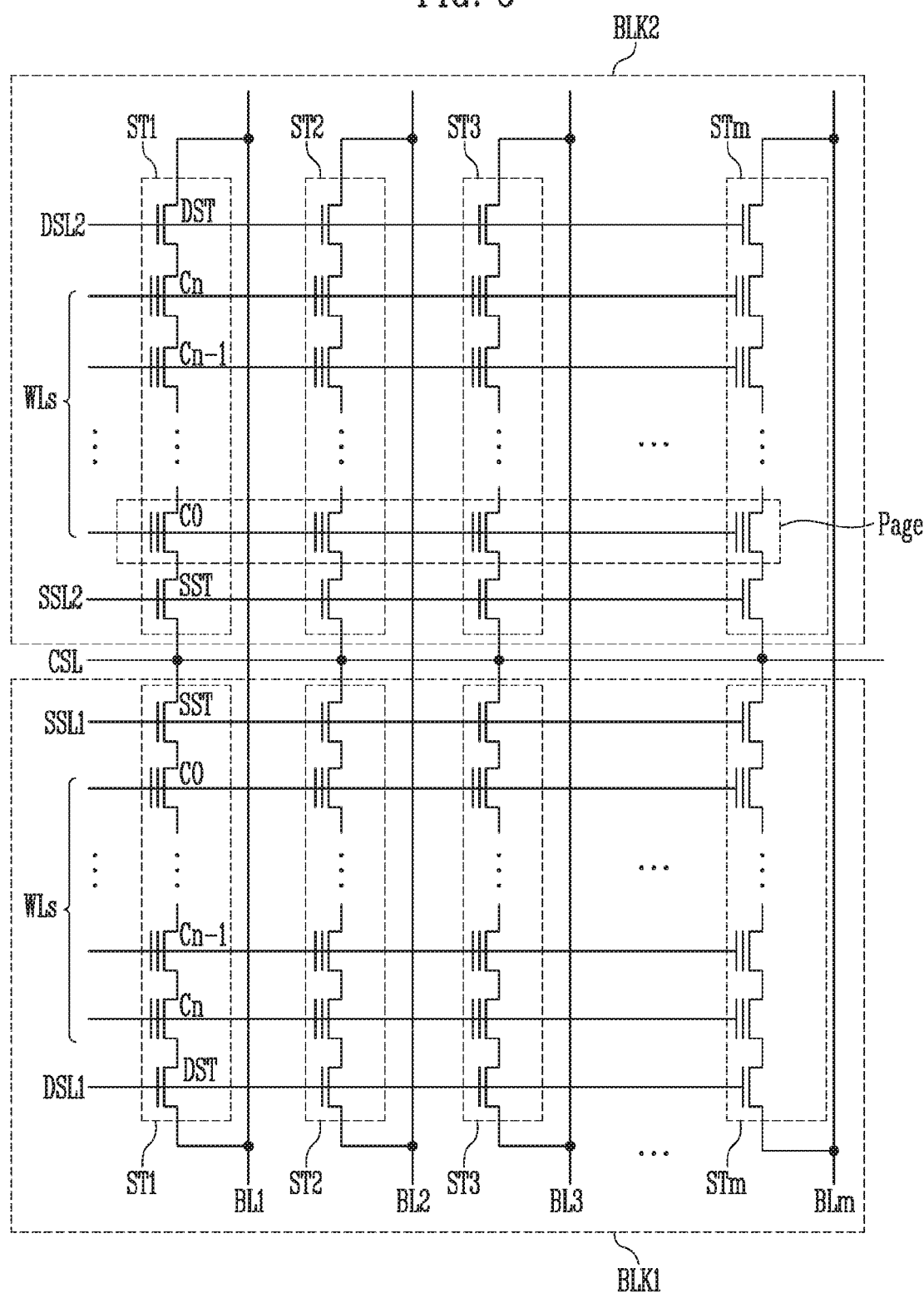
FIG. 5 is a circuit diagram illustrating an example memory block of FIG. 4.

FIG. 5 is an example circuit diagram for describing the memory block of FIG. 4.

In FIG. 4, the memory cell array may be configured to include the plurality of memory blocks. However, in FIG. 5, among the plurality of memory blocks, only the memory block BLK1 and the memory block BLK2 are shown for the purpose of concise illustration. The memory block BLK1 and the memory block BLK2 share bit lines BL1 to BLm and a common source line CSL.

Referring to FIG. 5, the memory block BLK1 and the memory block BLK2 are connected to the plurality of bit lines BL1 to BLm. The memory block BLK1 and the memory block BLK2 are memory blocks sharing the same word lines WLs. For example, when the memory block BLK1 is a selected memory block, the memory block BLK2 may be defined as a shared memory block of the memory block BLK1.

The memory block BLK1 includes a plurality of cell strings ST1 to STm. Each of the cell strings ST1 to STm is connected between a corresponding bit line and the common source line CSL. Each of the cell strings ST1 to STm includes a source select transistor SST, a plurality of memory cells C0 to Cn connected in series, and a drain select transistor DST. The source select transistor SST is connected to a source select line SSL1. The plurality of memory cells C0 to Cn are connected to the word lines WLs, respectively. The drain select transistor DST is connected to a drain select line DSL1. The common source line CSL is connected to a source side of the source select transistor SST. Each of the bit lines BL1 to BLm is connected to a drain side of the corresponding drain select transistor DST. Memory cells connected to the same word line are included in a same page.

The memory block BLK2 may be configured to have a structure similar to that of the memory block BLK1. Thus, the memory block BLK2 includes a plurality of cell strings ST1 to STm, and each of the cell strings ST1 to STm is connected between a corresponding bit line and the common source line CSL. Each of the cell strings ST1 to STm includes a source select transistor SST, a plurality of memory cells C0 to Cn connected in series, and a drain select transistor DST. The source select transistor SST is connected to a source select line SSL2. The plurality of memory cells C0 to Cn are connected to the word lines WLs, respectively. The drain select transistor DST is connected to a drain select line DSL2. The common source line CSL is connected to a source side of the source select transistor SST. Each of the bit lines BL1 to BLm is connected to a drain side of the corresponding drain select transistor DST.

As described above, the memory block BLK1 and the memory block BLK2 are configured to have a similar structure. The drain select lines DSL1 and DSL2 that are connected to the memory block BLK1 and the memory block BLK2, respectively, may be electrically separated from each other. The source select lines SSL1 and SSL2 that are connected to the memory block BLK1 and the memory block BLK2, respectively, may be electrically separated from each other.

Figure 6:
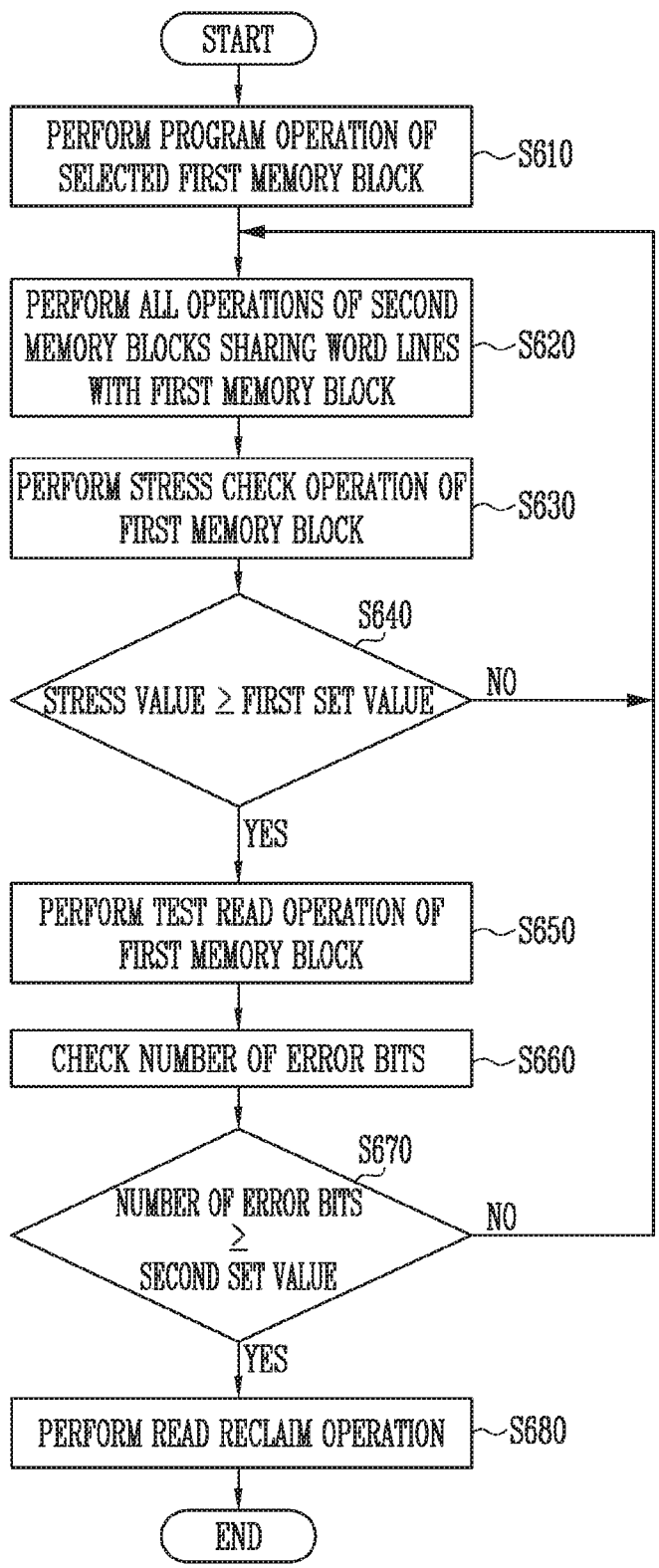
FIG. 6 is a flowchart illustrating an example set of operations of a memory system based on some implementations of the disclosed technology.

FIG. 6 is an example flowchart illustrating a set of operations that can be performed by the memory system based on some implementations of the disclosed technology.

The controller 1200 receives the host command (Host_CMD) and the address corresponding to the write command from the host 1300. The controller 1200 may receive a plurality of host commands (Host_CMD) from the host 1300.

The processor 1220 of the controller 1200 generates the command queue corresponding to the write operation in response to the host command (Host_CMD), and maps the logical address of the received address (ADD) to the physical address. The flash control block 1270 generates the internal command (CMD) for controlling the program operation of the memory device 1100 in response to the command queue generated by the processor 1220, and transmits the address (ADD) including the physical address mapped with the internal command (CMD) to the memory device 1100.

The memory device 1100 performs the program operation for the selected memory block (for example, BLK1) in response to the internal command (CMD) and the address (ADD) received from the controller 1200 (S610). For example, the control circuit 120 controls the voltage supply circuit 130, the page buffer group 140, the column decoder 150 and the input/output circuit 160 to perform the program operation in response to the command (CMD) corresponding to the program operation and the address (ADD) corresponding to the selected memory block. For the easy of descriptions, the selected memory block is referred to as a first memory block, and at least one or more shared memory blocks sharing the word lines WLs with the first memory block are referred to as second memory blocks.

After the program operation for the first memory block BLK1 is completed, the controller 1200 receives, from the host 1300, the address and the host command Host_CMD corresponding to at least one or more second memory blocks (for example, BLK2) sharing the word lines WLs with the first memory block BLK1. The controller 1200 transmits the internal command (CMD) and the address (ADD) corresponding to the second memory blocks BLK2 to the memory device 1100 in response to the received host command (Host_CMD) and address. The memory device 1100 performs operations for the second memory blocks BLK2, for example, the program operation, the read operation, the erase operation, or others, in response to the internal command (CMD) and the address (ADD) (S620).

After the operations of the second memory blocks BLK2 is completed, the stress check block 1240 of the controller 1200 performs the stress check operation for the first memory block BLK1 (S630).

For example, the stress check operation for the first memory block BLK1 may be performed based on the number of performances of the operations (the program operation, the read operation, and the erase operation) of at least one or more second memory blocks BLK2 sharing the word lines WLs with the first memory block BLK1. In some implementations, the same or different weights can be set for each of the program operations, the read operations, and the erase operations. For example, when the same weight is assigned regardless of the type of the operation, whenever the program operation, the read operation, or the erase operation on the second memory blocks BLK2 is performed, the stress value of the first memory block BLK1 is increased by 1. In some other implementations, different weights are set to each of the program operation, the read operation, and the erase operation. For example, for the program operation and the erase operation that use a relatively high operation voltage (for example, a program voltage or an erase voltage), the stress value may be increased by 2 and the increased stress value is counted. For the read operation using a relatively low operation voltage (for example, a read voltage), the stress value may be increased by 1 and the increased stress value is counted. The stress check operation includes counting the increased stress value after the operations are performed on one or more second memory blocks BLK2.

The stress check block 1240 compares the counted stress value of the first memory block BLK1 with a first set value (S640).

When it is determined at the step S640 that the stress value of the selected memory block is less than the first set value (No), the operation proceeds to the step S620.

When it is determined at the step S640 that the stress value of the selected memory block is equal to or greater than the first set value (Yes), the controller 1200 controls the memory device 1100 to perform the test read operation on the first memory block BLK1. Thus, the memory device 1100 performs the test read operation for the selected memory block BLK1 and transmits the read data to the controller 1200 (S650).

For example, the stress check block 1240 of the controller 1200 generates the command corresponding to the test read operation of the first memory block BLK1 and queues the generated command in the command queue. The flash control block 1270 generates and outputs the internal command (CMD) for controlling the memory device 1100 to perform the test read operation for the first memory block BLK1 in response to the command queue in which the command corresponding to the test read operation generated by the stress check block 1240 is queued. The memory device 1100 reads data stored in the first memory block BLK1 in response to the internal command (CMD) corresponding to the test read operation, and outputs the data to the controller 1200.

The error correction block 1260 of the controller 1200 detects the number of error bits included in the data read from the selected memory block during the test read operation and counts the detected number of error bits (S660). The counted number of error bits is transmitted to the reclaim control block 1250.

The reclaim control block 1250 compares the number of error bits received from the error correction block 1260 with the second set value (S670).

When it is determined at the step S670 that the number of error bits is less than the second set value (No), the operation proceeds to the step S620.

When it is determined at the step S670 that the number of error bits is equal to or greater than the second set value (Yes), the read reclaim operation for the first memory block BLK1 is performed (S680). For example, the reclaim control block 1250 generates the command corresponding to the read reclaim operation and queues the generated command in the command queue. The flash control block 1270 generates and outputs the internal command (CMD) so that the read reclaim operation for the first memory block BLK1 is performed in response to the command queue. In response to the internal command (CMD), the memory device 1100 performs the read reclaim operation that reads the valid data stored in the first memory block BLK1 and programs the read valid data in the target memory block (for example, BLKz) which is in an erase state.

Figure 7:
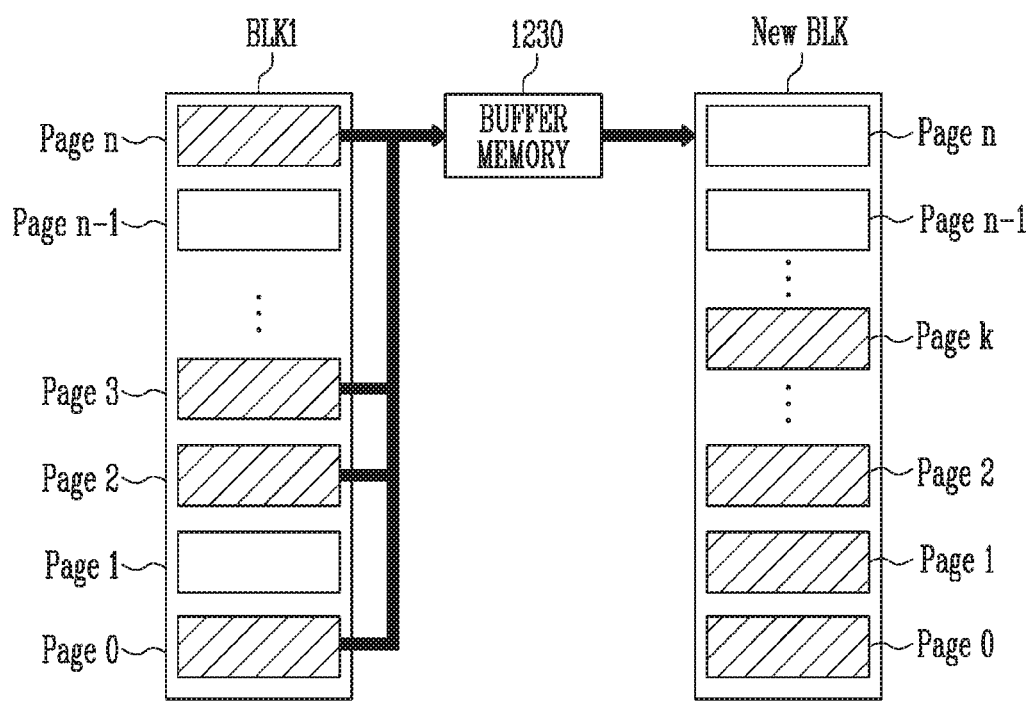
FIG. 7 is a diagram illustrating an example data flow of a read reclaim operation of a memory system based on some implementations of the disclosed technology.

FIG. 7 is a diagram illustrating an example data flow of a read reclaim operation of a memory system based on some implementations of the disclosed technology.

Referring to FIG. 7, the valid data stored in the selected memory block BLK1 is read and transmitted to the buffer memory 1230 during the read reclaim operation. In the embodiment of the disclosed technology, the valid data is stored in some pages (for example, PAGE 0, PAGE 2, PAGE 3, and PAGE n) of the selected memory block BLK1.

The valid data stored in the buffer memory 1230 is transmitted to a target memory block (New BLK) and programmed, for example, to a plurality of pages (for example, PAGE 0 to PAGE k) of the target memory block.

As described above, based on some implementations of the disclosed technology, after the program operation of the selected memory block is completed, the stress check operation of the selected memory block may be performed for the memory block sharing the word lines with the selected memory block, and the test read operation of the selected memory block may be performed based on a result of the stress check operation. Based on a result of the test read operation, the read claim operation may be performed. Accordingly, reliability of the data stored in the selected memory block can be checked through at least one of the stress check operation or the test read operation. In addition, through the read claim operation, the valid data stored in the selected memory can be read. Thus, reliability of the data read from the memory device can be improved.

Figure 8:
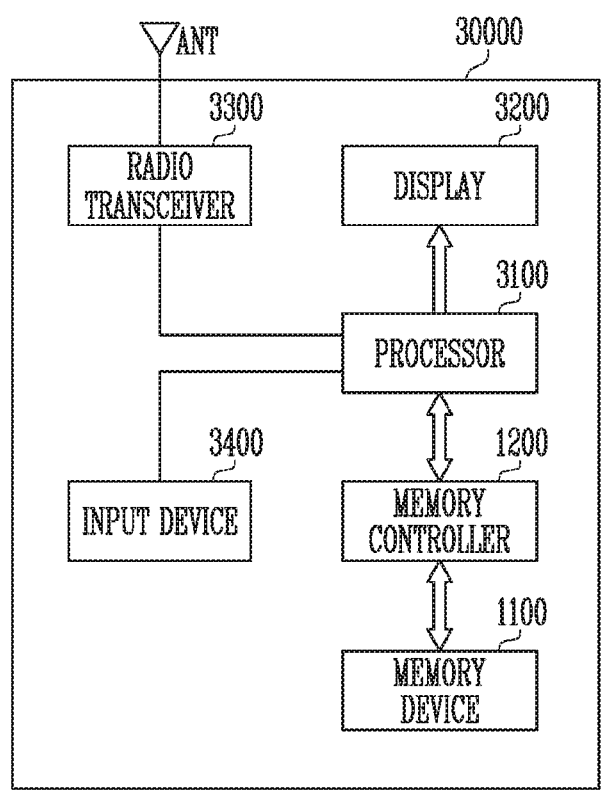
FIG. 8 is a diagram illustrating another example of a memory system based on some implementations of the disclosed technology.

FIG. 8 is a diagram illustrating another embodiment of the memory system based on some implementations of the disclosed technology.

Referring to FIG. 8, a memory system 30000 may be implemented as a cellular phone, a smart phone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In some implementations, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the memory controller 1200 capable of controlling the operation of memory device 1100 may be implemented as a part of the processor 3100 and may also be implemented as a chip separate from the processor 3100. In some implementations, the memory controller 1200 may be implemented through the example of the controller 1200 shown in FIG. 2.

Figure 9:
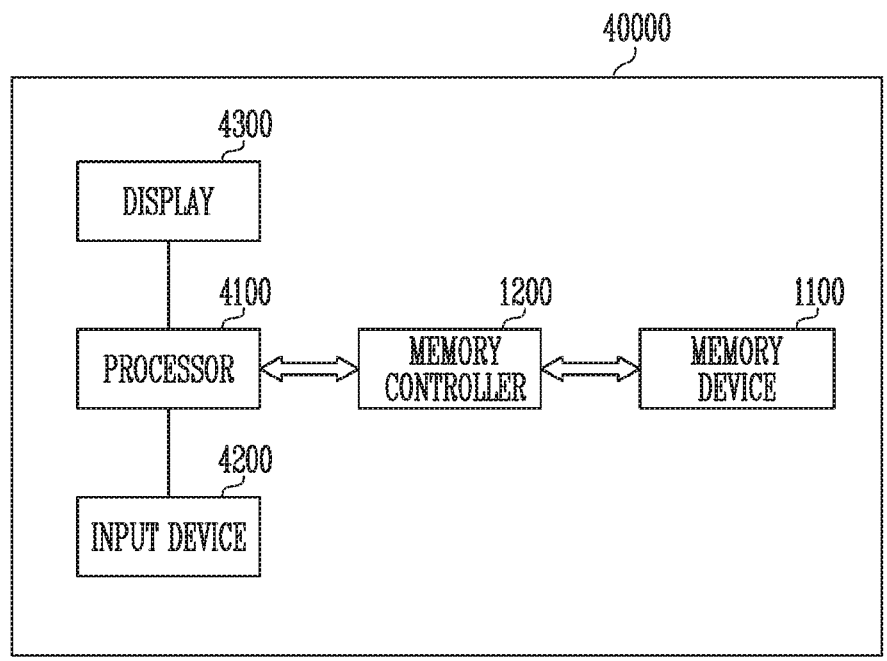
FIG. 9 is a diagram illustrating another example of a memory system based on some implementations of the disclosed technology.

FIG. 9 is a diagram illustrating another example of the memory system based on some implementations of the disclosed technology.

Referring to FIG. 9, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100. In some implementations, the memory controller 1200 may be implemented through the example of the controller 1200 shown in FIG. 2.

Figure 10:
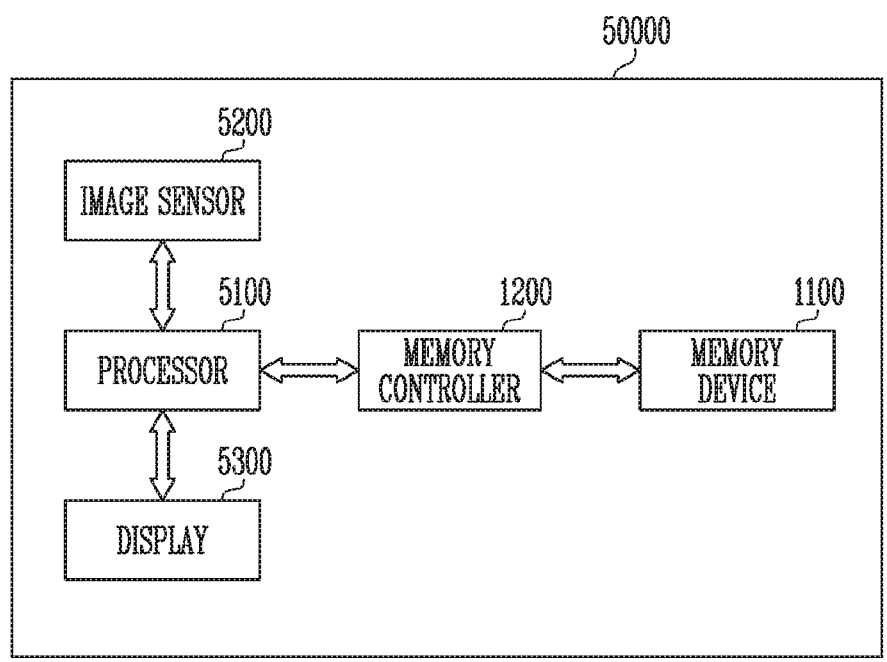
FIG. 10 is a diagram illustrating another example of a memory system based on some implementations of the disclosed technology.

FIG. 10 is a diagram illustrating another embodiment of the memory system based on some implementations of the disclosed technology.

Referring to FIG. 10, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100. In some implementations, the memory controller 1200 may be implemented through the example of the controller 1200 shown in FIG. 2.

Figure 11:
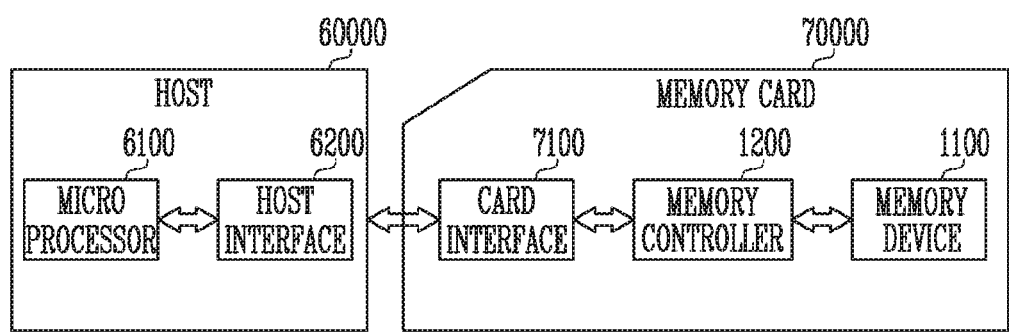
FIG. 11 is a diagram illustrating another embodiment of a memory system based on some implementations of the disclosed technology.

FIG. 11 is a diagram for illustrating another embodiment of the memory system based on some implementations of the disclosed technology.

Referring to FIG. 11, a memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto. In addition, the memory controller 1200 may be implemented through the example of the controller 1200 shown in FIG. 2.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the memory controller 1200 under control of a microprocessor 6100.

Although the detailed description of the present disclosure describes specific embodiments, various changes and modifications may be made.

In the embodiments described above, all of the steps may optionally be performed or omitted. In some implementations, the steps in each embodiment need not occur in order, and may be reversed.

What is claimed is:

1. A memory system, comprising:
   a memory device including a plurality of memory blocks, the memory device configure to perform on each of the plurality of memory blocks at least one of a program operation, a read operation, or an erase operation in response to an internal command; and
   a controller in communication with a host and the memory device and configured to receive a request from the host and generate the internal command in response to the request from the host, the controller further configured to control the memory device to perform a stress check operation on a first memory block of the plurality of memory blocks in which the program operation has been completed, and
   wherein the memory device includes a second memory block different from the first memory block, and the controller is configured to determine a stress value of the first memory block based on a number of program operations, a number of read operations, and a number of erase operations that have been performed on the second memory block.

2. The memory system of claim 1, wherein the second memory block is coupled to a word line that is coupled to the first memory block.

3. The memory system of claim 1, wherein the controller is configured to assign a corresponding weight to each of the program operations, each of the read operations, and each of the erase operations to determine the stress value.

4. The memory system of claim 1, wherein the controller is configured to control the memory device to perform a test read operation on the first memory block for which the stress value is determined to be equal to or greater than a first predetermined stress value.

5. The memory system of claim 4, wherein the memory device is configured to read data stored in the first memory block and output the read data to the controller during the test read operation.

6. The memory system of claim 5, wherein the controller is configured to detect one or more error bits in the read data received from the memory device and to perform a read reclaim operation on the first memory block based on a number of detected error bits.

7. A memory system, comprising:
a memory device including a plurality of memory blocks, the memory device configured to perform on each of the plurality of memory blocks at least one of a program operation, a read operation, or an erase operation; and
a controller in communication with the memory device and including: a stress check component configured to instruct the memory device to perform a stress check operation for a first memory block of the plurality of memory blocks, and generate a first command for a test read operation based on a result of the stress check operation;
an error correction component configured to detect one or more error bits in a plurality of read data during the test read operation, and produce a count of the detected error bits; and
a reclaim control component configured to generate a second command for a read reclaim operation based on the count of the detected error bits.

8. The memory system of claim 7, wherein the first command and the second command are stored in a command queue of the controller and the controller further includes a control component configured to generate a third command based on the first command and the second command, the third command configured to instruct the memory device to perform the test read operation and the read reclaim operation.

9. The memory system of claim 7, wherein the stress check component is configured to determine a stress value of the first memory block based on a number of program operations, a number of read operations, and a number of erase operations that have been performed on a second memory block different from the first memory block.

10. The memory system of claim 9, wherein the second memory block and the first memory block are arranged to share word lines.

11. The memory system of claim 7, wherein the stress check component is configured to assign a weight to each of the program operations, each of the read operations, and each of the erase operations to determine the stress value.

12. The memory system of claim 7, wherein the controller is configured to receive the plurality of read data from the first memory block as a result of the test read operation.

13. The memory system of claim 7, wherein the stress check component is configured to generate the first command upon a determination that a stress value of the first memory block is equal to or greater than a first set value, and the reclaim control component is configured to generate the second command upon a determination that the count of the detected error bits is equal to or greater than a second predetermined value.

14. A method of operating a memory system, the method comprising:
performing a program operation on a first memory block included in the memory system, wherein the memory system includes at least a second memory block coupled to a word line to which the first memory block is coupled;
performing one or more operations on the second memory block, the one or more operations including a program operation, a read operation, or an erase operation; and
performing a stress check operation on the first memory block to determine a stress value of the first memory block,
wherein the performing of the stress check operation determines the stress value of the first memory block based on a number of program operations, a number of read operations, and a number of erase operations that have been performed on the second memory block.

15. The method of claim 14, further comprising:
performing a test read operation for the first memory block that has the stress value equal to or greater than a first predetermined stress value.

16. The method of claim 15, further comprising:
receiving data read from the first memory block as a result of the test read operation;
detecting one or more error bits in the data read from the first memory block; and
performing, based on a number of the detected error bits, a read reclaim operation to move data stored in the first memory block to another memory block.

17. The method of claim 14, wherein the performing of the stress check operation includes assigning a corresponding weight to each of the program operations, each of the read operations, and each of the erase operations.

* * * * *